United States Patent [19]
Coleman

[11] Patent Number: 5,822,343
[45] Date of Patent: Oct. 13, 1998

[54] OPERATING AND CONTROL SYSTEM FOR LASERS USEFUL IN BAR CODE SCANNERS

[75] Inventor: Edward P. Coleman, Fairport, N.Y.

[73] Assignee: PSC Inc., Webster, N.Y.

[21] Appl. No.: 296,788

[22] Filed: Aug. 26, 1994

[51] Int. Cl.⁶ ........................................................ H01S 3/13
[52] U.S. Cl. ................................ 372/31; 372/38; 372/24; 372/25
[58] Field of Search ................................ 372/25, 24, 29, 372/38, 37

[56] References Cited

U.S. PATENT DOCUMENTS

| | | | |
|---|---|---|---|
| 3,898,583 | 8/1975 | Shuey | 372/38 |
| 4,081,670 | 3/1978 | Albanese | 372/38 |
| 4,577,320 | 3/1986 | Yoshikawa et al. | 372/38 |
| 4,709,369 | 11/1987 | Howard | 372/38 |
| 4,751,717 | 6/1988 | Chenausky | 372/82 |
| 5,142,544 | 8/1992 | Donahue et al. | 372/32 |
| 5,179,269 | 1/1993 | Horie et al. | 372/25 |
| 5,255,276 | 10/1993 | Tabuchi et al. | 372/32 |
| 5,260,554 | 11/1993 | Grodevant . | |
| 5,267,253 | 11/1993 | Nakatani | 372/25 |
| 5,268,914 | 12/1993 | Yamamuro et al. | 372/38 |
| 5,323,409 | 6/1994 | Laskoskie et al. | 372/32 |
| 5,323,477 | 6/1994 | Lebby et al. | 385/129 |
| 5,363,387 | 11/1994 | Sinofsky | 372/25 |
| 5,373,518 | 12/1994 | Uchiyama et al. | 372/38 |

*Primary Examiner*—Leon Scott, Jr.
*Attorney, Agent, or Firm*—Joseph F. Murphy

[57] ABSTRACT

In order to set the output optical power of a laser diode precisely and under digital control without expensive digital to analog conversion devices, a digital controller provides a sequence of pulses. A capacitor is charged by these pulses to produce a control voltage which controls the current through the laser diode via an operational amplifier driver stage. The output power obtained from the laser as detected by a photodetector, which is optically coupled to the laser and may be packaged therewith, is monitored by the computer so as to determine the rate at which laser power changes and indirectly at the rate at which the capacitor charges. This rate may vary depending upon environmental conditions and manufacturing tolerances. Based upon the charging rate, a pulse is generated and used to either provide additional charge or to charge the capacitor to the voltage corresponding to the desired optical power output. Thus, relatively low cost capacitors and other components which may have values of capacitance, resistance and the like, which vary from component to component and with temperature, aging and other environmental effects may be used in providing a digitally controlled and selected laser optical output. In a bar code scanner the operating pulses may be generated at the start of each scan or at the start of a sequence of pulses in a pulse train utilized to locate bar codes prior to initiation of scanning.

17 Claims, 5 Drawing Sheets

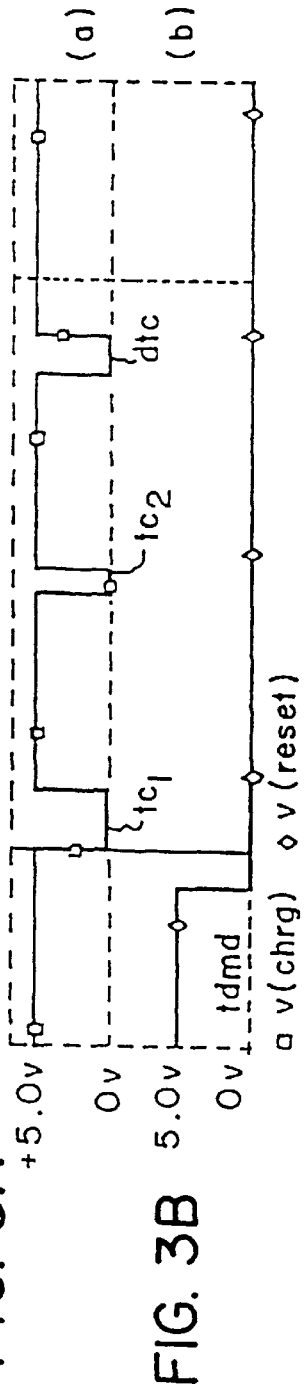
FIG. 3A
FIG. 3B
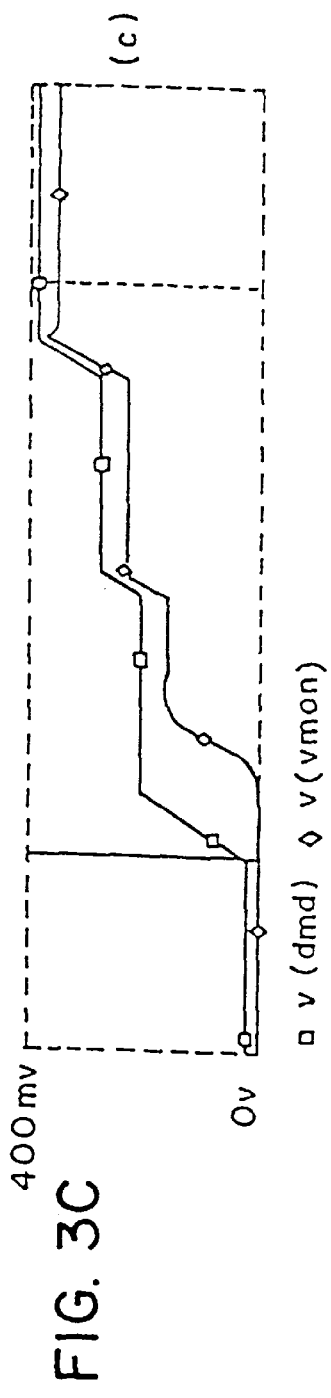
FIG. 3C
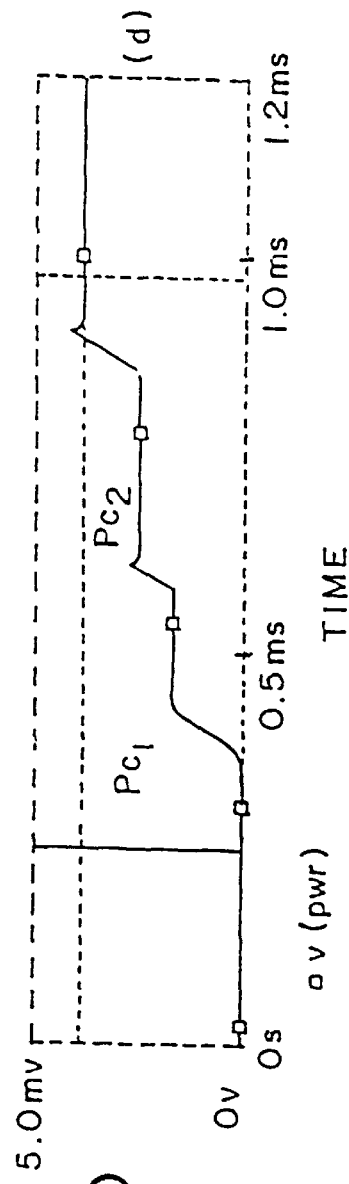
FIG. 3D

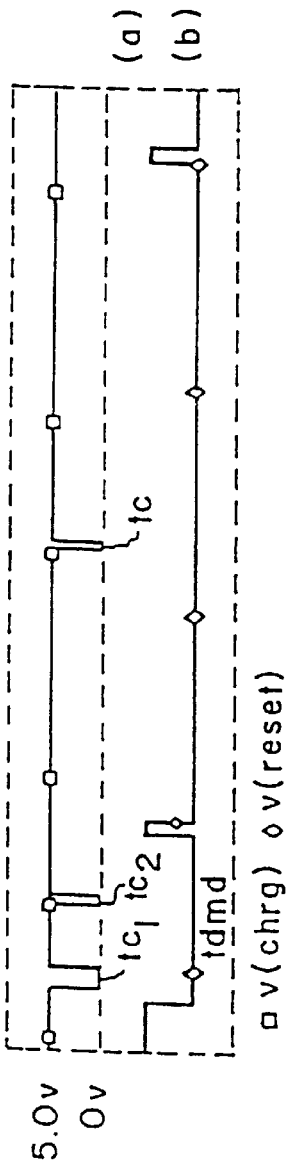
FIG. 4A
FIG. 4B
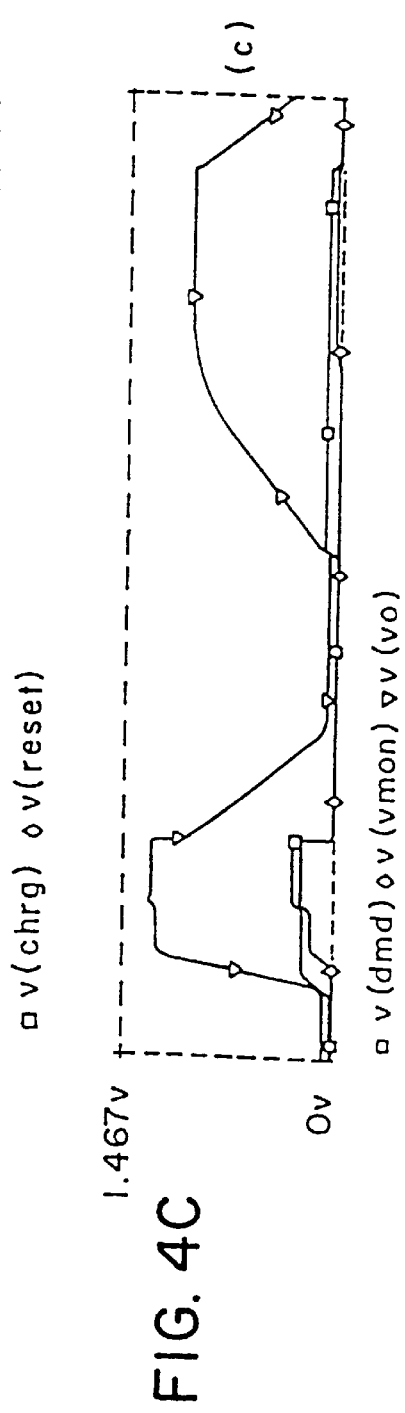
FIG. 4C
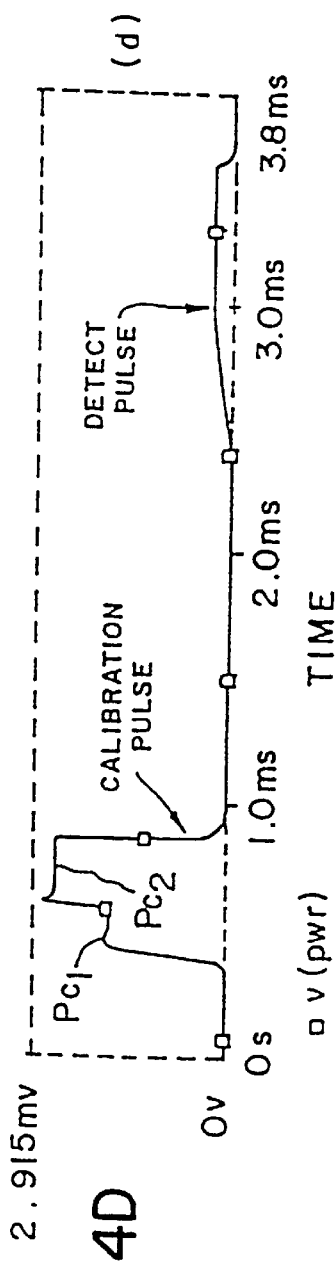
FIG. 4D

OPERATING AND CONTROL SYSTEM FOR LASERS USEFUL IN BAR CODE SCANNERS

DESCRIPTION

The present invention relates to systems (methods and apparatus) and circuits for establishing and controlling the optical power or illumination provided in a beam from a laser and particularly a laser diode, the output optical power of which depends upon the amplitude of the current which passes therethrough, thereby controlling that current so as to set and maintain the optical power at a desired level.

The invention is especially suitable for use in bar code scanners for controlling lasers, especially laser diodes used therein for generating the beam which illuminates and which may scan bar codes so that the beam power is maintained for the reliable reading of the bar codes over the entire operating distance range between the scanner and the code and not limiting the operation to a range in the immediate vicinity of the scanner.

Establishment and maintenance of optical power (and the intensity of illumination) provided by a laser is required for consistent and reliable operation of various optical devices and particularly scanners such as bar code scanners which depend upon the light returned from an object, such as the bar code, in order to provide return light from which the data represented by the code can be recovered. Different lasers, including lasers such as laser diodes from the same batch vary in their output as a function of electrical driving signal amplitude. For example, the laser power per laser drive current, which is usually specified in milliwatts per milliamp (mW/mA) may vary. Moreover, laser output power is, in most laser diodes, an exponential function of the laser drive current, thus making control of the output power very sensitive in one part of the operating range and requiring extremely stable control signals, but highly insensitive to changes in control signal at low laser powers.

It is also desirable to set the laser output power digitally and to vary the power with changing conditions. Digital control devices such as digital to analog converters and digitally operated potentiometers have been used successfully in laser optical power output systems and particularly in systems for laser power control in bar code scanners. Reference is had to U.S. Pat. No. 5,260,554, issued Nov. 9, 1993 to S. R. Grodevant for such a laser control circuit and as well for a digital controller, including a computer for setting and controlling laser operating power via a digital potentiometer.

It is a feature of this invention to provide a laser operating system which sets and controls laser optical power digitally without using digital to analog converters or digital potentiometers, such as used in the above referenced patent.

An ancillary feature of the invention is that the laser operating system requires less area, for example on the circuit board which mounts the laser and other optical and electronic components of the scanner (conventionally called a scan engine such that), the required area is reduced, thereby contributing to the reduction in size and miniaturization of such scan engines.

It is desireable to operate a laser either in a pulse mode or in a continuous mode. A continuous beam may be used while scanning and the beam may be generated in a train of pulses to automatically sense the presence of an object or bar code label. When the label is sensed, the scanning mode is initiated. The above referenced patent describes the use of pulses of lower power than the power of the continuous beam utilized during scanning. It is a feature of the present invention to obtain in a laser operating system which does not require expensive components, such as the aforementioned digital potentiometers and digital to analog converters, and which accurately establishes optical power in a pulse mode and a continuous mode of laser operation.

Briefly described, a system for controlling an electrically driven laser in accordance with the invention maintains a desired, selected optical power or intensity of illumination of the beam from the laser. This system may use a digital controller which includes a computer. The laser may be a laser diode having an optical power monitoring element optically coupled to the laser. The computer provides a series of pulses and controls the duration of at least one of the pulses in that series in accordance with the optical power monitored by the controller. The optical power is monitored in timed relationship with the occurrence of at least two of the pulses in this series so that another of the pulses is generated with a duration related to the desired output, as well as to the duration of at least one of the pulses in the series which proceeded the power setting pulse. A capacitor is connected in electrical driving relationship with the laser and effectively converts the duration of the pulses to electrical driving signals of amplitude corresponding to the voltage to which the capacitor is charged. Thus, the power is monitored and the duration of the pulses which set the operating power is digitally controlled. Since the power is monitored at at least two points in time in the charging cycle of the capacitor, the rate of charge (the slope of the charging voltage versus time relationship which is a linear relationship), may vary depending upon environmental conditions and the capacitance of the capacitor. The pulse which sets the power can therefore be varied in duration to compensate for changes in the capacitance value of the capacitor and variation in charging current due principally to variations (tolerances) in the components of the charging circuit. Accordingly, low cost capacitors which may vary in capacitance, say 20% to 30% from capacitor to capacitor in a batch, may be used without sacrificing the accuracy or reliability of the laser operating system and standard transistors and resistors can be used to construct the charging circuit.

The foregoing and other features, objects and advantages of the invention will become apparent from a reading of the following description in connection with the accompanying drawings which illustrate a presently preferred embodiment of the invention. These figures are as follows:

FIGS. 3A–3D are more detailed timing diagrams illustrating the operation of the system of FIGS. 1 and 2 in the continuous output mode; and FIGS. 4 and 4A–4D are respectively less and more detailed timing diagrams illustrating the operation of the operating system shown in FIG. 1 and the circuits shown in FIG. 2 in the pulse mode.

Figure 1:
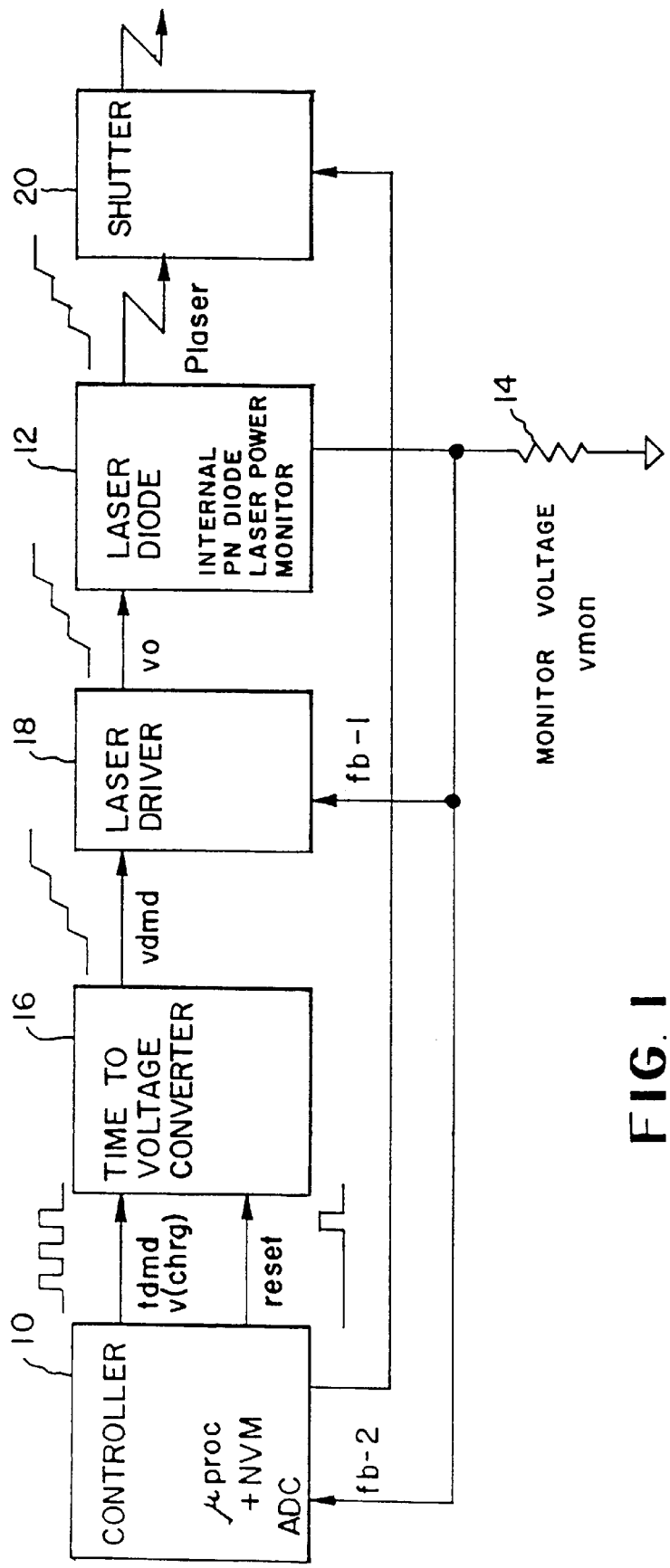
FIG. 1 is a block diagram of a laser diode operating system.

Referring first to FIG. 1, there is shown a digital controller 10 which includes a microprocessor computer and nonvolatile memory (NVM) such as shown in the above-referenced Grodevant patent. The microprocessor preferably has a built-in analog digital converter (ADC) or the controller may utilize a separate ADC device. The outputs from the microprocessor are a series or sequence of pulses indicated as tdmd and also as V(chrg). These three pulses are shown above the tdmd line. One of these pulses, namely the last, determines the output optical power (Plaser) from a laser diode 12 which has an internal photodetector optically coupled to the laser diode for monitoring the laser power and providing a current through a monitor resistor 14. The voltage across this resistor is the monitor voltage (Vmon). This monitor voltage is a feedback voltage fb-2 to ADC input of the controller 10.

The controller also generates a reset pulse. This pulse is timed to occur at the end of a scan during continuous laser power output or after each pulse of laser power is produced during the pulse mode of operation, which is used in the laser scanner to detect the presence of an object or bar code label and initiate scanning. Reference may be had to the Grodevant patent for the design of the software and hardware which provides the pulse mode and the continuous scanning mode and also signals which are generated at the start of each scan (SOS).

Figure 2:
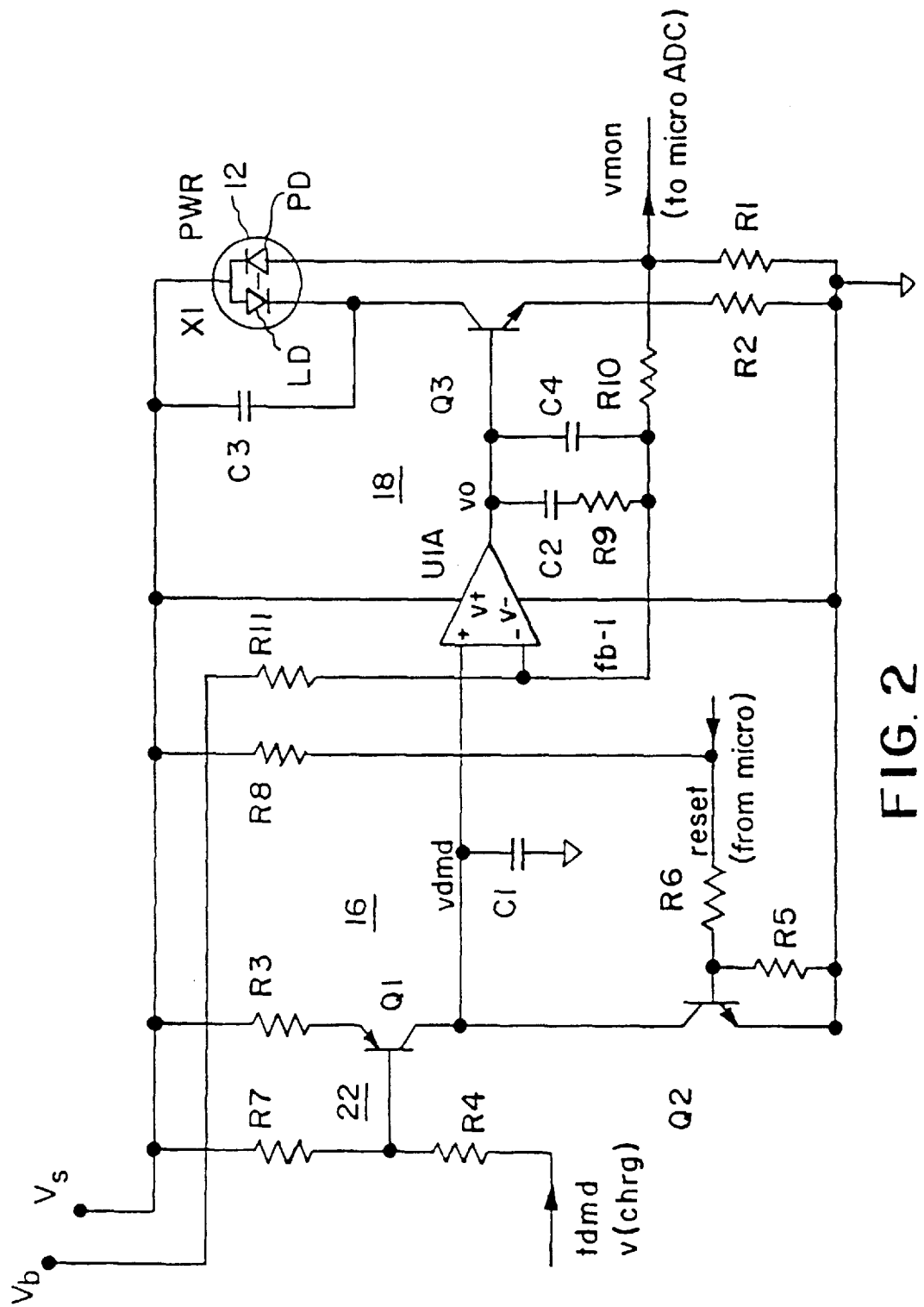
FIG. 2 is a schematic diagram of the time to voltage converter, laser driver and laser diode of the system illustrated in FIG. 1.
Figure 3:
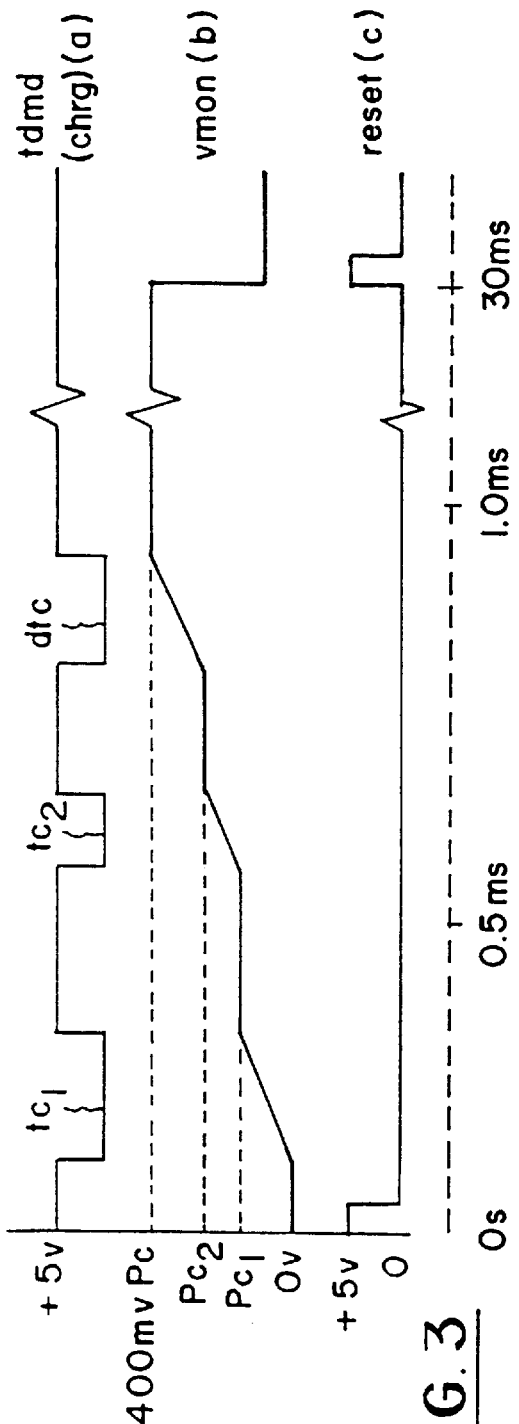
FIG. 3 is a timing diagram of signals and pulses appearing in the system and circuit shown in FIGS. 1 and 2 for the continuous optical output power mode of operation of the system.
Figure 4:
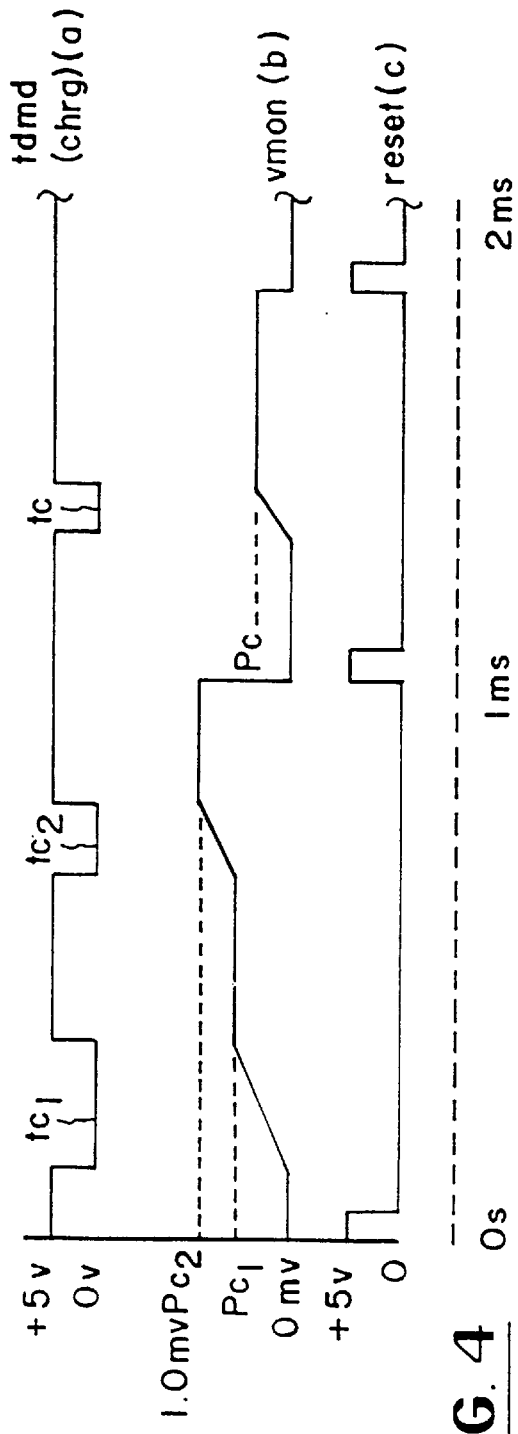

The tdmd pulses are called V(chrg) since they are used to charge a capacitor (C1-FIG. 2). The duration of these pulses is converted to a corresponding voltage in a time to voltage converter 16. For the three tdmd pulses shown above the tdmd line, a quasi staircase waveform to a desired demand voltage Vdmd shown above the Vdmd line is obtained. This demand voltage is applied to a laser driver stage 18 which produces a drive voltage (Vo) for controlling the current through the laser diode 12. The laser driver 18 is also in feedback relationship with the laser diode and receives the monitor voltage as a feedback voltage (fb-1).

During calibration or at the start of each scan before the demand voltage attains the value corresponding to the desired laser power (Plaser), it may be desired, optionally, to cut off the output beam from the laser. To this end, a shutter 20 controlled by the controller 10 may be used. Alternatively, the mirror of the scanner or the laser mount may be moved so as to tilt the beam away from a window through which the beam projects. The term shutter includes the hardware or software in the controller necessary to control the tilting of the mirror or laser mount or the introduction of a physical shutter.

Referring to FIG. 2, the circuit shown includes the laser 12, the time to voltage converter 16, and the laser driver 18. The operating voltage is supplied from a supply voltage source indicated as $V_s$ which may be of a level usual for TTL logic circuits, namely, 5 volts to ground. A bias voltage $V_B$ is utilized as an offset voltage (here 1.2 volts) in order to assure laser cutoff when the time to voltage converter 16 is reset. The monitor resistor 14 is indicated as R1 in FIG. 2. The demand voltage Vdmd is generated by charging a capacitor C1 via a current source 22 provided by Q1, R3, R4 and R7. C1, therefore, charges at a linear rate for the duration of each pulse of the tdmd (time demand) pulses.

The capacitor need not be a special high tolerance capacitor, but may be a low cost capacitor; the capacitance value of which is rated to a tolerance of 20–30%. There are also tolerances in each of the resistors and in the transistors such that the Vdmd voltage as a function of the duration of the tdmd pulses may vary. However, the relationship is monotonic, and particularly is linear. The system is operative to adjust one of the tdmd pulses, and particularly last in a succession of the three consecutive pulses so as to translate tdmd into Vdmd of the amplitude corresponding to the desired laser output power.

The continuous laser power output mode of operation Vdmd is maintained during the scan. Vdmd is maintained only during the duration of the laser pulses which are generated during the pulse mode of operation. A reset circuit responsive to the reset pulse from the microprocessor of the controller 10 includes Q2, R5 and R6. Q2 provides a discharge path for Cl when the reset pulse is applied thereto. The leakage of current from C1 until the reset pulse is applied is limited because the principal leakage paths are through the emitter and collector junctions of Q1 and Q2 which presents a very high resistance when cut-off. Also, the input to the laser driver 18 is at the direct input of an operational amplifier U1A which is also a very high resistance. Thus, the Vdmd voltage may be maintained for sufficient time to complete a scan. The scan time may vary from 20 to 70 milliseconds (ms).

U1A has a direct input (+), also called a noninverting input, and inverting input (−). The operating voltage is applied between so-called rail inputs v+ and v−. The output of U1A is V0. This output is applied to a voltage to current converter (a transconductance element including Q3 and R2). The collector to emitter path of Q3 and R2 are in series with the laser diode LD of the laser diode photodetector unit X1.

Laser power (Plaser) is an exponential function of laser current. The output of the photodetector (Vmon) is a linear function of the laser power and is fed back to the inverting input as fb-1 via an isolating resistor R10 much higher than R1. Accordingly, the relationship between Vdmd and also V0 and the laser drive current is logarithmic, due to the laser diode's exponential response in the feedback loop. But the relationship between Vmon and also Vdmd and laser optical power is linear, because the photodiode PD current vs. optical power characteristic is linear over the operating range. A compensating network to prevent oscillation is also connected in feedback relationship between the output and the inverting input of U1A. This compensation network consists of C2, C4, R9 and R 10. A capacitor C3 is connected across LD to suppress noise in the supply voltage $V_s$ from affecting the current through LD.

The system is calibrated during manufacture in order to determine the ADC count corresponding to the desired output power and the time counts (duration of tdmd pulses) needed to produce the desired output power. For example, output power may be 4 mW which corresponds to a monitor voltage of 400 mV. The controller may send short pulses each corresponding to a time count. These pulses may be 3 microseconds in duration. While the pulses are generated, the number of counts is stored corresponding to the Vmon amplitude for the desired power level. The calibration may require a hundred or more 3 microsecond pulses to reach the desired Vmon amplitude. The Vmon output, corresponds to the desired power Pc from the laser. The number of counts obtained by the ADC of the microprocessor and the number of counts corresponding to the tdmd pulse are stored in the memory of the controller.

Refer to FIGS. 3 and 3A–3D, for continuous wave or continuous laser power output operation. A first pulse of duration $tc_1$ suitably half the number of counts (half the duration) of the pulse time measured during calibration is used as $tc_1$. Prior to $tc_1$, the capacitor is discharged by application of the reset pulse (see line c in FIG. 3 and (b) in FIG. 3B). The capacitor $C_1$ charges during $tc_1$ and achieves a level corresponding to $Pc_1$ after a period for stabilization, say 100 microseconds. $Pc_1$ is stored in memory of the computer in ADC counts. The next pulse duration $tc_2$ is generated. $tc_2$ is a fraction, say 30% of $tc_1$. Thus, if $tc_1$ is approximately 100 microseconds, $tc_2$ may suitably be 30 microseconds in duration. After $tc_2$ and before the final pulse which is indicated as having a duration of vtc. Accordingly, after a stabilization period, the Vmon voltage (corresponding to $Pc_2$) is again measured in the controller. There are now two points of measurement and counts which are stored in the controller corresponding to the durations of $tc_1$, $tc_2$, $Pc_1$ and $Pc_2$. From these counts, by using a linear regression or least squares computation, the number of counts or duration for dtc in order to obtain 400 mV for Vmon corresponding to 4 milliwatts of power can be computed in the microprocessor of the controller. This computation makes the system forgiving for variations in tolerances in the capacitor and other components of the system. The system, therefore, is capable of accurately selecting the desired laser power while preventing the voltage to which the capacitor is charged from causing the laser to be driven at more than a safe operating current, thereby preventing destruction of the laser.

The controller is programmed to compute the following equation:

$$dtc = dP_c \frac{tc_2}{Pc_2 - Pc_1}$$

where:

dtc is the additional charge time in counts (minimum resolvable time elements, 3 µs in this example).

Pc is the desired power setting in counts.

dPc is the desired change in power in counts ($Pc-Pc_2$).

$tc_1$ is the charge time for the first charge pulse in counts.

$tc_2$ is the charge time for the second charge pulse in counts.

$Pc_1$ is the first sample laser power in counts (Vmon).

$Pc_2$ is the second sample laser power in counts (Vmon).

In FIG. 3D, line (d) the optical of the laser diode power is shown. Also shown are the points in time when the sample laser power is measured.

The pulse mode of operation will be more apparent from FIGS. 4 and 4A–4D. In the pulse mode, it is desirable that the laser power be less than during the continuous wave mode. For example, each pulse may have a power of 250 microwatts rather than 4 milliwatts as in the continuous wave mode. It is difficult to accurately set the duration of a tdmd pulse (here tc) which corresponds to such a low power level. This difficulty arises because of the low pulse durations which would be needed and also because there is an offset voltage applied to the inverting input of the operational amplifier U1A in the laser driver 18 (FIG. 2). This offset voltage assures that when the capacitor C1 is discharged, the discharge voltage will always be less than the bias or offset voltage, thereby driving V0 to ground and cutting off Q3 and the current through the laser diode LD so there is no power output from the laser 12. Accordingly, it is desired to set the duration of tc with pulses that are longer than tc. This is accomplished by using pulses $tc_1$ and $tc_2$ which may be of the same duration as used on setting the power during continuous wave operation. The capacitor is first reset before these pulses $tc_1$ and $tc_2$ are applied. Also, the power is measured after $tc_1$ and before $tc_2$ and after $tc_2$. This measurement indicates the slope of the charging curve (that is, the slope of the dmd versus time)and the bias of the curve due to the offset applied to the investing input of U1A. These values are stored in the computer of the controller 10 during $tc_1$ and $tc_2$. From these power readings (in counts) and from the duration of $tc_1$ and $tc_2$, the desired duration of tdmd to obtain the low power pulse may be computed in the computer of the controller 10 in accordance with the following equation:

$$tc = Pc \underbrace{\frac{tc_2}{Pc_2 - Pc_1}}_{\text{slope}} + \underbrace{tc_1 - Pc_1 \frac{tc_2}{Pc_2 - Pc_1}}_{\text{Bias}}$$

The first term represents the slope of the power characteristic, (time counts per power counts). The second and third terms represent the bias or offset. In the equation, tc is the duration of the pulse which will obtain the desired power Pc, both measured in counts of 3 microseconds duration in this example. $tc_1$ is the time of the first pulse and $tc_2$ is the time of the second pulse, again, in counts. $Pc_1$ is the first sample laser power in counts (Vmon) and $Pc_2$ is the second sampled laser power in counts from Vmon.

The reset pulse is generated after $tc_2$ and also after the duration of the laser pulse resulting from tc (called the detect pulse) because it is used in the scanner to detect an object or a label prior to initiating normal scanning operations. Thus, reset is asserted prior to asserting each $tc_1$ pulse and starting the detect pulse from the laser and reset is used to end the detect pulse. (See FIG. 4 line (c)). FIGS. 4A–4D show the shape of the pulses in terms of the voltages in the system and circuit and also in line (d) of FIG. 4D in terms of the optical power emitted by the laser diode.

A sequence of pulses $tc_1$, $tc_2$ and tc is not necessary for the train of pulses used in the detect or object sensing mode of operation of the scanner. The value tc may be stored in the computer and regenerated after each reset pulse to provide a series of 15 to 20 low power detect pulses. Also, the output Vmon may be sampled after the tc pulse to allow the laser output power to stabilize and tc for the next pulse modified slightly to correspond to the desired output power. Table I below provides, by way of example, the components and component values for a presently preferred embodiment of the circuit illustrated in FIG. 2.

TABLE I

| | | |
|---|---|---|
| U1A | Operational amplifier | Texas Instruments TLC272 |
| Q1 | PNP Transistor | 2N 3906 |
| Q2 | NPN Transistor | 2N 3904 |
| Q3 | NPN Transistor | 2N 4401 |
| X1 | Laser Drode | Toshiba TOLD 99221M |
| C1 | Capacitor | 0.1 µf (microforads) ± 20% |
| C2 | Capacitor | 220 pf (picoforads) |
| C3 | Capacitor | 0.022 µf |
| C4 | Capacitor | 100 pf |
| R1 | Resistor | 1.5 k (kilo-ohms) |
| R2 | Resistor | 20 ohms |
| R3 | Resistor | 6.8 k |
| R4 | Resistor | 15.0 k |
| R5 | Resistor | 47 k |
| R6 | Resistor | 47 k |
| R7 | Resistor | 12 k |
| R8 | Resistor | 47 k |
| R9 | Resistor | 6.8 k |
| R10 | Resistor | 47 k |
| R11 | Resistor | 1 M (meg-ohms) |

From the foregoing description, it will be apparent that there has been provided an improved system for operating a laser and particularly setting the power thereof. Variations and modifications in the herein described system in accordance with the invention will undoubtedly suggest themselves to those skilled in the art. Accordingly, the foregoing description should be taken as illustrative and not in a limiting sense.

I claim:

1. A system for controlling an electrically driven laser to maintain a desired output optical power in a beam therefrom, said system generating a plurality of pulses and comprising:

a digital controller, said controller having a circuit coupled to said laser which monitors laser optical power, said controller also having a computer operative to control a duration of at least one of said plurality of pulses dependent upon the optical power monitored by said circuit so that the duration of said at least one of said plurality of pulses is related to said desired output optical power and the duration of at least one of two pulses of said plurality of pulses;

a capacitor connected in electrical driving relationship with said laser to output optical power corresponding to a voltage to which said capacitor is charged; and a charging circuit charging said capacitor dependent upon the duration of said plurality of pulses.

2. The system according to claim 1 wherein:

said plurality of pulses occur in successive order.

3. The system according to claim 2 wherein:

the duration of said at least one of said plurality of pulses when said laser is operating in continuous mode of operation is computed from the following equation:

$$dtc = dP_c \frac{tc_2}{Pc_2 - Pc_1}$$

wherein:

dtc is the duration of said at least one of said plurality of pulses;

$Pc_1$ is the monitored power corresponding to a first of said two pulses;

$tc_2$ is the duration of a second of said two pulses;

$Pc_2$ is the monitored power corresponding to said second of said two pulses;

Pc is said desired output optical power; and dPc is the difference between Pc and $Pc_2$.

4. The system according to claim 1 further comprising:

a bar code scanner containing said laser, said laser producing a beam which scans a bar code repeatedly, said bar code scanner also containing said controller and said computer, said computer having means operative to generate said plurality of pulses at the start of each scan and to reset said system by discharging said capacitor at the end of each scan.

5. The system according to claim 1 wherein:

said computer having means operative to reset said system at a given rate thereby causing said laser to generate said at least one of said plurality of pulses upon each reset and to generate said beam in successive pulses at said rate.

6. The system according to claim 4 wherein:

said at least one of said plurality of pulses has a duration less than said two pulses of said plurality of pulses thereby providing said beam in pulses of said desired output optical power.

7. The system according to claim 5 further comprising:

means for inhibiting said laser from providing said beam until after the duration of the last of said two pulses of said plurality of pulses.

8. The system according to claim 4 wherein:

the duration of said at least one of said plurality of pulses when said laser is operating in a pulse mode of operation is computed from the following equation:

$$tc = Pc \frac{tc_2}{Pc_2 - Pc_1} + tc_1 - Pc_1 \frac{tc_2}{Pc_2 - Pc_1}$$

wherein:

tc is the duration of said at least one of said plurality of pulses;

Pc is said desired output optical power;

$tc_1$ is the duration of a first of said two pulses;

$Pc_1$ is the monitored power corresponding to said first of said two pulses;

$tc_2$ is the duration of a second of said two pulses; and $Pc_2$ is the monitored power corresponding to said second of said two pulses.

9. The system according to claim 1 wherein: said laser is a laser diode device including a photodetector providing an output corresponding to the optical power of said beam.

10. A circuit for operating a current responsive laser diode having a photodetector optically coupled thereto, which provides a photodetector current representative of the illumination produced by said laser diode, comprising:

an operational amplifier having a direct and an inverting input and an output;

a voltage responsive, current control device connected in series with said laser diode for controlling laser current;

a monitoring resistor connected in series with said photodetector for providing a first voltage corresponding to said photodetector current, said output of said operational amplifier being connected to said current control device, and said inverting input being connected to said monitoring resistor, thereby coupling said laser diode and said photodetector in a feedback relationship such that a second voltage applied to said direct input is linearly related to optical power generated by said laser diode in response to the laser current;

a capacitor connected to said direct input for applying said second voltage of an amplitude corresponding to the voltage to which said capacitor is charged;

a current source for charging said capacitor when enabled by control pulses; and a reset circuit providing a discharge path for current from said capacitor for discharging said capacitor when enabled by reset pulses.

11. The circuit according to claim 10 further comprising:

an offset circuit connected to said inverting input of said operational amplifier for setting said output of said operational amplifier to a voltage at which said current control device is cut off, thereby making said laser diode inoperative when said capacitor is discharged.

12. The circuit according to claim 10 further comprising:

a pulse generator which generates said control pulses and said reset pulses.

13. The circuit according to claim 12 wherein: said pulse generator is responsive to said first voltage for selecting the duration of at least one of said control pulses.

14. A method for operating a laser to deliver an optical output of desired power comprising the steps of:

generating a power-setting, electrical pulse;

charging a capacitor for the duration of said power-setting, electrical pulse to convert said power-setting, electrical pulse into a voltage corresponding to the desired power;

driving said laser with said voltage;

monitoring the output power of the laser; and varying the duration of said power-setting, electrical pulse in response to the laser output power to maintain the desired power.

15. The method according to claim 14 wherein:

said generating step further comprises the steps of generating a first pulse and a second pulse prior to generating said power-setting, electrical pulse; and said monitoring step being carried out between the occurrence of said first pulse and said second pulse, and between the occurrence of said second pulse and said power-setting, electrical pulse; and said varying step being carried out to select the duration of said power-setting, electrical pulse in response to the laser output power.

16. The method according to claim 15 wherein:

the duration of said power-setting, electrical pulse when said laser is operating in a continuous mode of operation is computed from the following equation $$dtc = dP_c \frac{tc_2}{Pc_2 - Pc_1}$$

wherein:

dtc is the duration of said power-setting, electrical pulse;

$Pc_1$ is the monitored laser output power corresponding to said first pulse;

$tc_2$ is the duration of said second pulse;

$Pc_2$ is the monitored laser output power corresponding to said second pulse;

Pc is the desired power; and dPc is the difference between Pc and $Pc_2$.

17. The method as defined in claim 15 wherein:

the duration of said power-setting, electrical pulse when said laser is operating in a pulse mode of operation is computed from the following equation:

$$tc = Pc \frac{tc_2}{Pc_2 - Pc_1} + tc_1 - Pc_1 \frac{tc_2}{Pc_2 - Pc_1}$$

wherein:

tc is the duration of said power-setting, electrical pulse;

Pc is the desired power;

$tc_1$ is the duration of said first pulse;

$Pc_1$ is the monitored laser output power corresponding to said first pulse;

$tc_2$ is the duration of said second pulse; and $Pc_2$ is the monitored laser output power corresponding to said second pulse.

* * * * *